(12) United States Patent
Baek (10) Patent No.: US 10,074,444 B2
(45) Date of Patent: Sep. 11, 2018

(54) REPAIR CIRCUIT, SEMICONDUCTOR APPARATUS AND SEMICONDUCTOR SYSTEM USING THE SAME

(71) Applicant: SK hynix Inc., Icheon-si, Gyeonggi-do (KR)

(72) Inventor: Young Hyun Baek, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 337 days.

(21) Appl. No.: 15/048,226

(22) Filed: Feb. 19, 2016

(65) Prior Publication Data

US 2017/0083398 A1     Mar. 23, 2017

(30) Foreign Application Priority Data

Sep. 18, 2015  (KR) .......................... 10-2015-0132597

(51) Int. Cl.
*G11C 29/44* (2006.01)
*G11C 29/00* (2006.01)

(52) U.S. Cl.
CPC .............. *G11C 29/44* (2013.01); *G11C 29/78* (2013.01); *G11C 29/783* (2013.01); *G11C 29/789* (2013.01); *G11C 29/812* (2013.01)

(58) Field of Classification Search
CPC ............. G06F 11/0793; G06F 11/0727; G06F 11/0751; G06F 11/079; G11C 29/44; G11C 29/78; G11C 29/783; G11C 29/289; G11C 29/811; G11C 29/808; G11C 29/812; G11C 29/802
See application file for complete search history.

(56) References Cited

U.S. PATENT DOCUMENTS

| | | | | |
|---|---|---|---|---|
| 5,134,583 A | * | 7/1992 | Matsuo | G11C 29/78 365/189.05 |
| 7,099,209 B2 | * | 8/2006 | Kang | G11C 29/808 365/185.11 |
| 7,120,068 B2 | * | 10/2006 | Lakhani | G11C 29/76 365/200 |
| 8,797,808 B2 | * | 8/2014 | Jeong | G11C 8/00 365/189.011 |
| 2006/0274586 A1 | * | 12/2006 | Takai | G11C 29/802 365/200 |
| 2009/0158087 A1 | * | 6/2009 | Maeno | G11C 29/44 714/6.12 |

FOREIGN PATENT DOCUMENTS

KR     1020160042221 A     4/2016

* cited by examiner

*Primary Examiner* — Shelly A Chase
(74) *Attorney, Agent, or Firm* — William Park & Associates Ltd.

(57) ABSTRACT

A repair circuit may be provided. The repair circuit may include a latch array including a plurality of latch sets. The repair circuit may include a fuse array including a plurality of fuse sets, and configured to be written, in each fuse set, with repair address data and latch address data which defines a position of a latch set where the repair address data is to be stored, among the plurality of latch sets. The repair circuit may include a first decoder configured to cause data written in any one fuse set among the plurality of fuse sets to be outputted, and a second decoder configured to cause the repair address data to be stored in the latch set corresponding to the latch address data among the plurality of latch sets.

28 Claims, 9 Drawing Sheets

REPAIR CIRCUIT, SEMICONDUCTOR APPARATUS AND SEMICONDUCTOR SYSTEM USING THE SAME

CROSS-REFERENCES TO RELATED APPLICATION

The present application claims priority under 35 U.S.C. § 119(a) to Korean application number 10-2015-0132597, filed on Sep. 18, 2015, in the Korean Intellectual Property Office, which is incorporated herein by reference in its entirety.

BACKGROUND

1. Technical Field

Various embodiments generally relate to a semiconductor circuit, and, more particularly, to a repair circuit, a semiconductor apparatus and a semiconductor system using the same.

2. Related Art

A semiconductor apparatus may use a fuse to store information of a memory cell in which a fail has occurred, among memory cells.

Recently, a repair operation may be performed even after packaging. The repair operation is performed by using an e-fuse. The e-fuse is capable of updating fuse information through a rupture operation.

Figure 1:
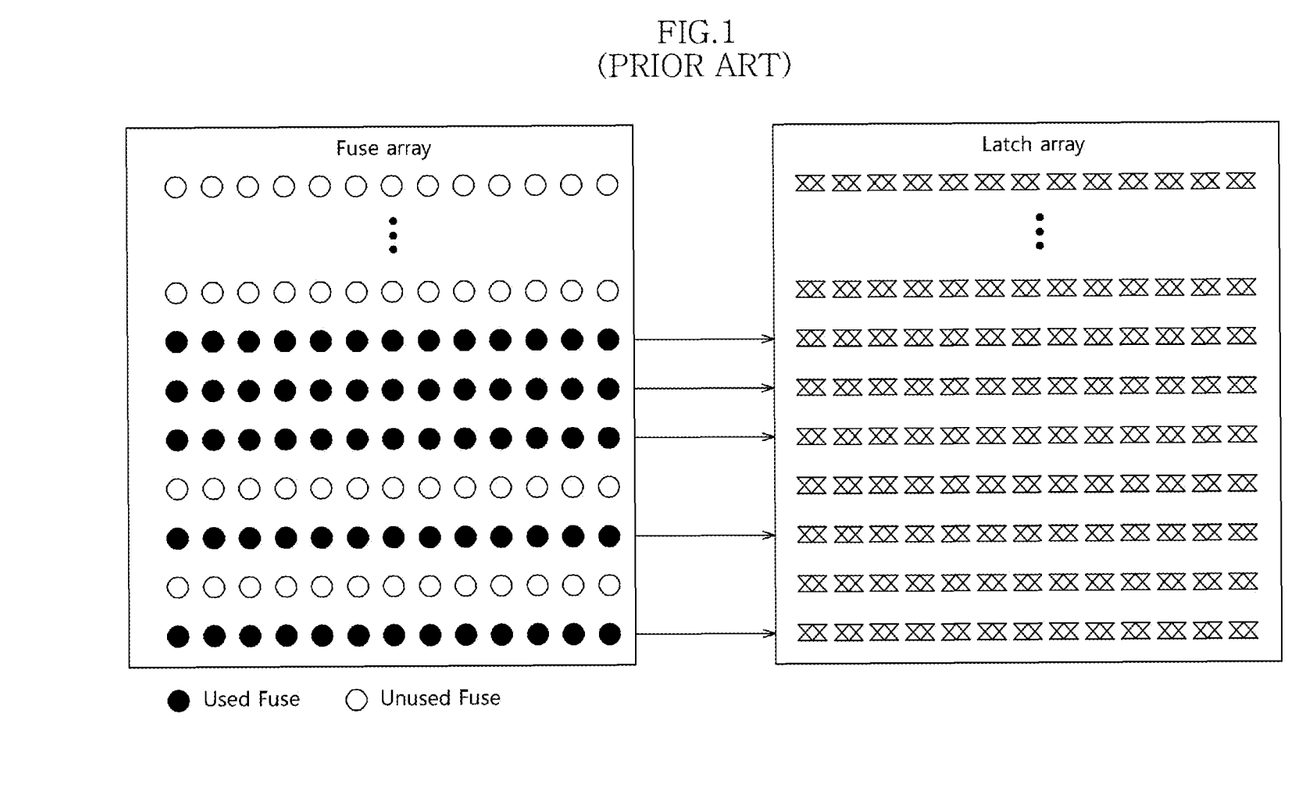
FIG. 1 is a diagram to assist in the explanation of an example of using a fuse array according to the conventional art.

Referring to FIG. 1, a repair circuit according to the conventional art has a structure in which a fuse array and a latch array are matched one to one.

When viewed in the row direction, fuses of the fuse array are referred to as fuse sets, and latches of the latch array are referred to as latch sets.

A fuse set of the fuse array and a latch set of the latch array on the same line when viewed in the row direction are matched one to one.

In the fuse array, entire fuse sets may be allocated, by the unit of a predetermined number, to respective redundancy sections including redundancy memory cells for replacing memory cells which are determined as fails.

Therefore, after a wafer test or a package test, a large number of unused fuses exist in the entire fuse array, as illustrated in FIG. 1.

As a result, in the conventional repair circuit, problems may be caused in that efficiency of the fuse array is degraded and a circuit area increases due to the fuse array.

SUMMARY

Various embodiments are directed to a repair circuit capable of reducing a circuit area and ensuring a stable repair operation, a semiconductor apparatus and a semiconductor system using the same.

In an embodiment, a repair circuit may include: a latch array including a plurality of latch sets; a fuse array including a plurality of fuse sets, and configured to be written, in each fuse set, with repair address data and latch address data which defines a position of a latch set where the repair address data is to be stored, among the plurality of latch sets; a first decoder configured to cause data written in any one fuse set among the plurality of fuse sets to be outputted, according to a counting signal; and a second decoder configured to cause the repair address data to be stored in the latch set corresponding to the latch address data among the plurality of latch sets.

In an embodiment, a semiconductor apparatus may include: a memory cell array; a latch array including a plurality of latch sets; a fuse array including a plurality of fuse sets, and configured to be written, in each fuse set, with repair address data or weak cell data and latch address data which defines a position of a latch set where the repair address data or the weak cell data is to be stored, among the plurality of latch sets; a first decoder configured to cause data written in any one fuse set among the plurality of fuse sets to be outputted, according to a counting signal; a second decoder configured to cause the repair address data or the weak cell data to be stored in the latch set corresponding to the latch address data among the plurality of latch sets; and a refresh control circuit configured to control a refresh operation for a memory cell corresponding to the weak cell data in the memory cell array.

In an embodiment, a semiconductor system may include: a plurality of stacked semiconductor chips; and a processor configured to access the plurality of stacked semiconductor chips, wherein at least one of the plurality of stacked semiconductor chips comprises a plurality of fuse sets and a plurality of latch sets, and wherein repair address data and latch address data are stored in each of the plurality of fuse sets, and the repair address data is stored in a latch set corresponding to the latch address data among the plurality of latch sets.

According to the embodiments, it is possible to reduce a circuit area and perform a stable repair operation, and unused fuses may be used in controlling a refresh operation.

DETAILED DESCRIPTION

Various embodiments may be directed to a repair circuit capable of reducing a circuit area and ensuring a stable repair operation, a semiconductor apparatus and a semiconductor system using the same.

According to the embodiments, it may be possible to reduce a circuit area and perform a stable repair operation, and unused fuses may be used in controlling a refresh operation.

Hereinafter, a repair circuit, a semiconductor apparatus and a semiconductor system using the same will be described below with reference to the accompanying drawings through various examples of embodiments.

Figure 2:
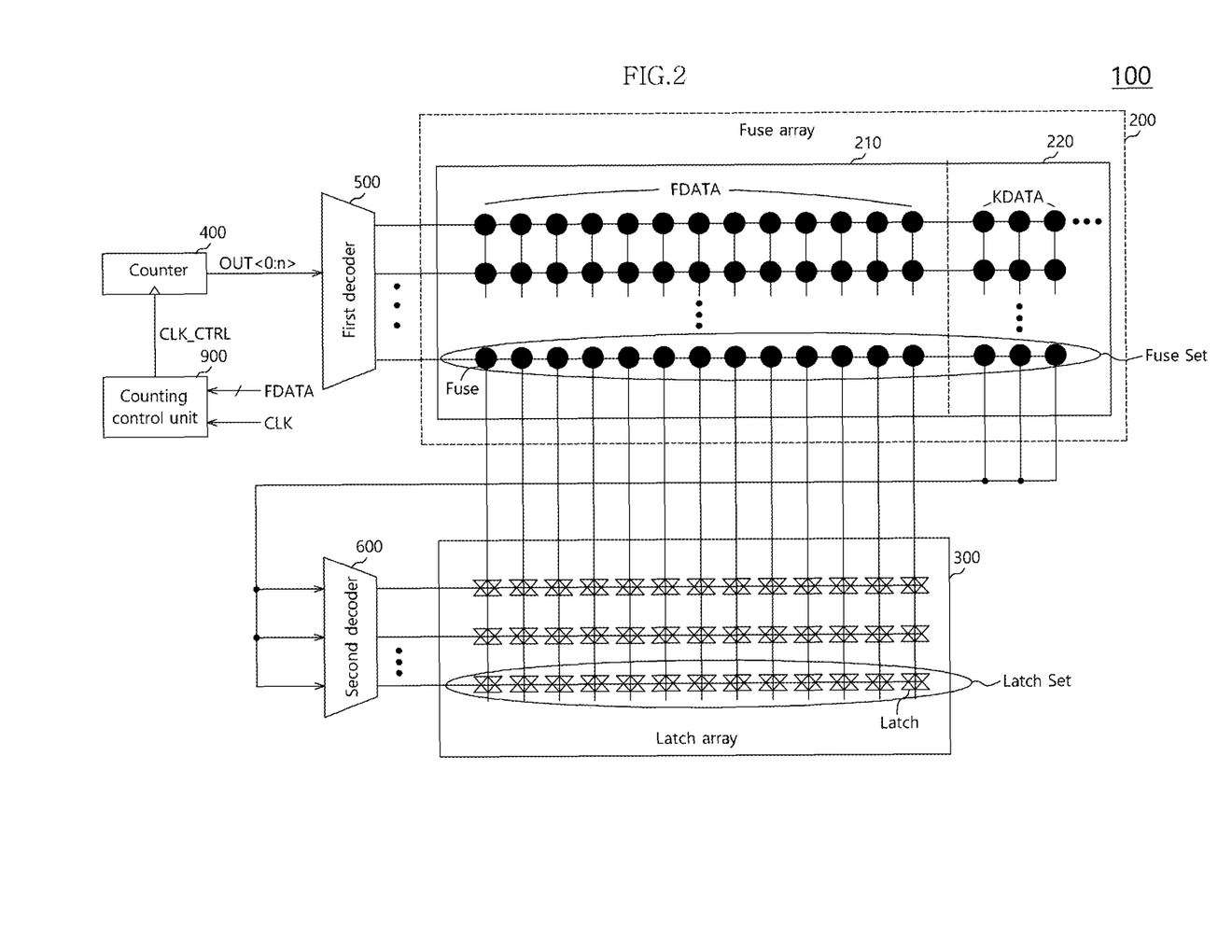
FIG. 2 is a diagram illustrating a representation of an example of the configuration of a repair circuit 100 in accordance with an embodiment.

Referring to FIG. 2, a repair circuit 100 in accordance with an embodiment may include a fuse array 200, a latch array 300, a counter 400, a first decoder 500, a second decoder 600, and a counting controller 900.

The latch array 300 may include a plurality of latches. The plurality of latches may be divided by the unit of latches in a row direction, that is, a latch set.

Repair address data FDATA may be stored in each latch set of the latch array 300.

The fuse array 200 may be configured to store repair address data FDATA and latch address data KDATA which define positions where the repair address data FDATA are to be stored, among the latch sets of the latch array 300.

Repair address data FDATA may be addresses of memory cells which are determined as fails in a memory cell array.

The fuse array 200 may include a first fuse array region 210 for storing repair address data FDATA and a second fuse array region 220 for storing latch address data KDATA.

The fuses of the fuse array 200 may be divided by the unit of fuses in the row direction, that is, a fuse set.

After a test process, for example, a wafer test or a package test, a row address and a column address corresponding to a memory cell determined as a fail may be detected.

The detected row address and column address may be written in fuse sets of the first fuse array region 210 of the fuse array 200 as repair address data FDATA, through a rupture process, and latch address data KDATA corresponding to the repair address data FDATA may be written in the second fuse array region 220.

The counter 400 may be configured to increase (or decrease) the value of a counting signal OUT<0:n> according to a clock signal CLK_CTRL.

The first decoder 500 may be configured to select any one of the fuse sets of the fuse array 200 according to the counting signal OUT<0:n>.

The first decoder 500 may sequentially select the fuse sets of the fuse array 200, starting from a most significant fuse set or a least significant fuse set, according to the counting signal OUT<0:n>.

Repair address data FDATA and latch address data KDATA may be outputted from a fuse set of the fuse array 200 which is selected by the first decoder 500.

The second decoder 600 may be configured to select a latch set corresponding to a result of decoding latch address data KDATA, among the latch sets of the latch array 300.

The repair address data FDATA outputted from the fuse set of the fuse array 200 may be stored in the latch set which is selected by the second decoder 600.

The counting controller 900 may be configured to generate the clock signal CLK_CTRL which controls an enable period of a source clock signal CLK, according to repair address data FDATA.

As may be readily seen from the configurations described above with reference to FIG. 2, the repair circuit 100 in accordance with an embodiment may select a latch set where repair address data FDATA is to be stored, among all the latch sets of the latch array 300, by using latch address data KDATA.

Figure 3:
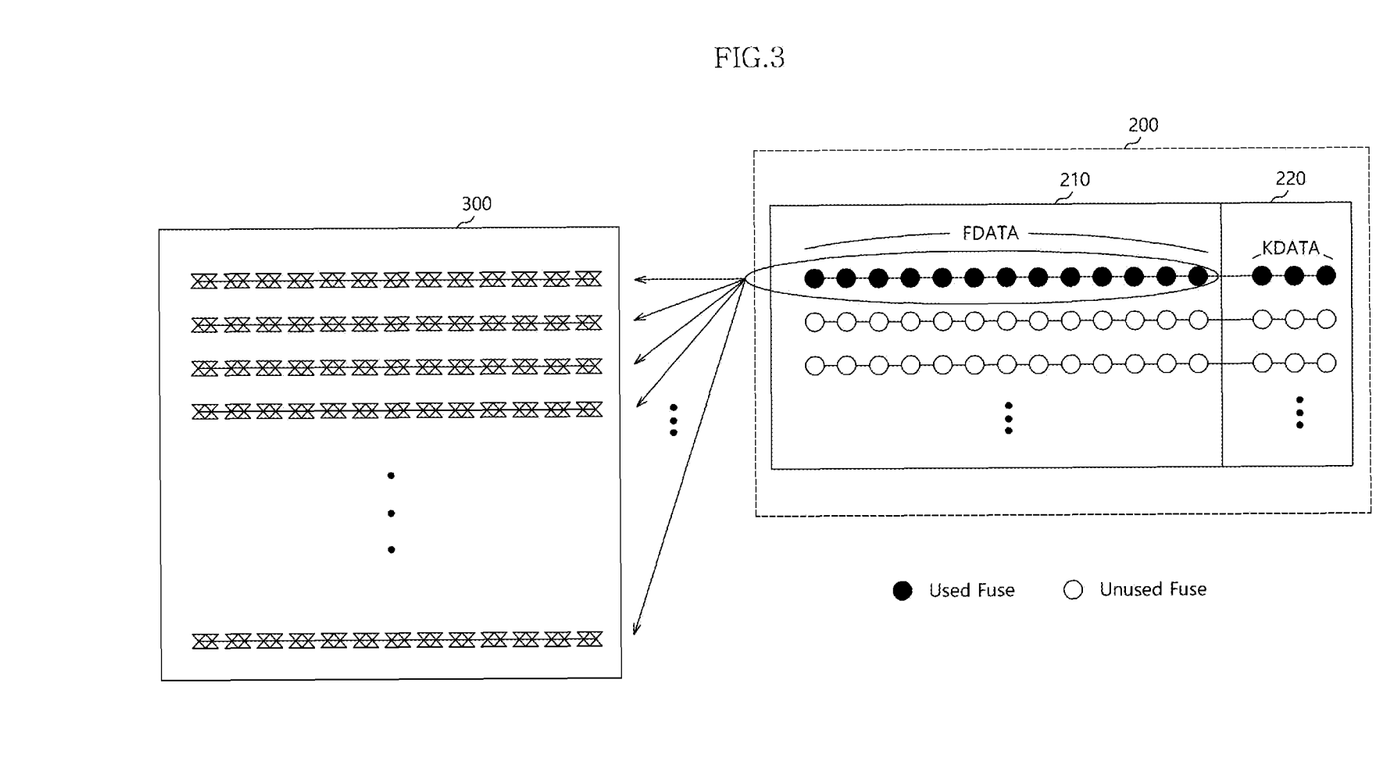
FIG. 3 is a representation of an example of a diagram to assist in the explanation of an example of matching a fuse array 200 to a latch array 300 in accordance with an embodiment.

Accordingly, referring to FIG. 3, each of the fuse sets of the fuse array 200 may be matched with any latch set among all the latch sets of the latch array 300.

Figure 4:
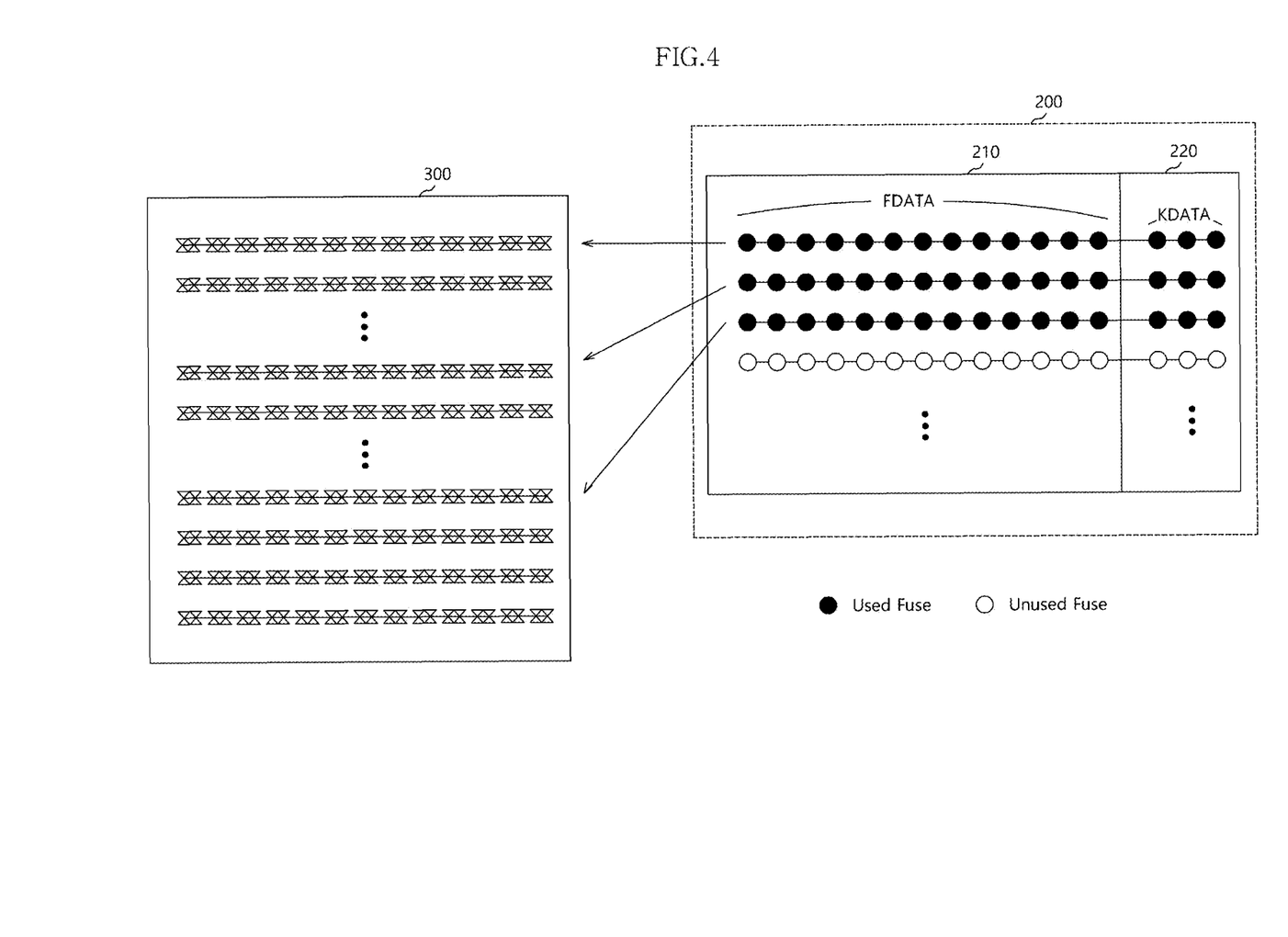
FIG. 4 is a representation of an example of a diagram to assist in the explanation of an example of using the fuse array 200 according to an embodiment.

Referring to FIG. 4, according to an embodiment, repair address data FDATA and latch address data KDATA may be written in a desired fuse set among the fuse sets of the fuse array 200.

For example, repair address data FDATA and latch address data KDATA may be sequentially written, starting from a fuse set of a most significant turn in the row direction.

Therefore, a different kind of data other than repair address data FDATA and latch address data KDATA may be used by being written in surplus fuse sets which are not used.

For example, as a different kind of data, data related with a refresh operation may be written.

Figure 5:
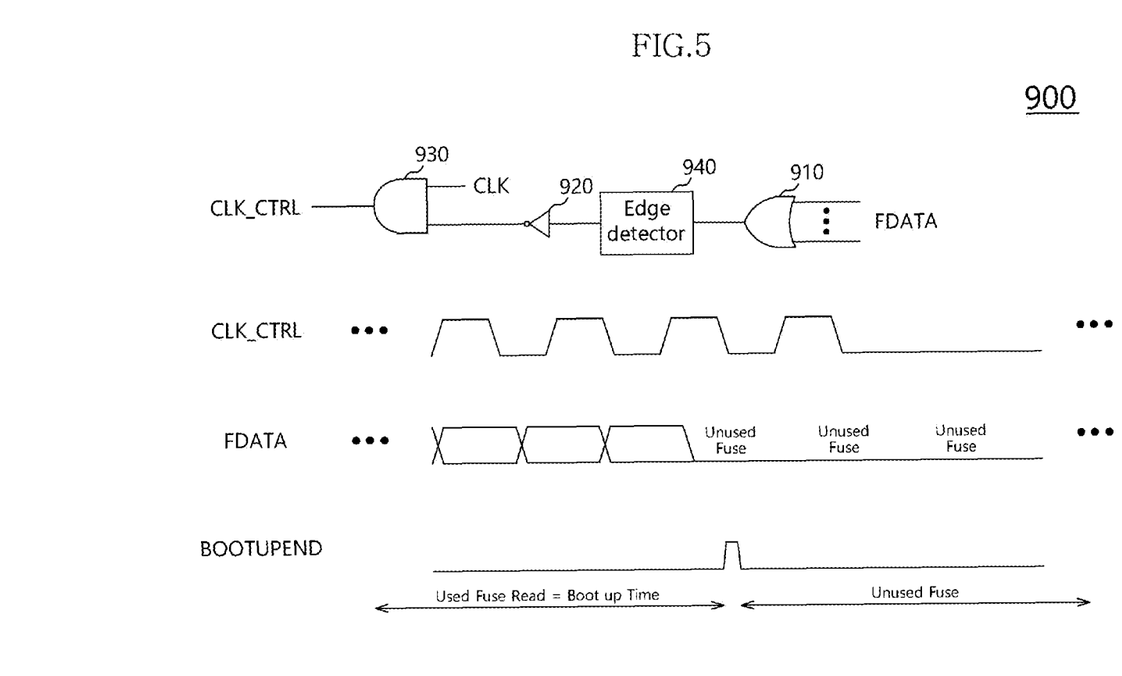
FIG. 5 is a diagram illustrating a representation of an example of the configuration and operation timing of the counting controller 900 illustrated in FIG. 2.

Referring to FIG. 5, the counting controller 900 may include first to third logic gates 910 to 930 and an edge detector 940.

The first logic gate 910 may output a result of performing an OR logic function on repair address data FDATA.

The edge detector 940 may generate a boot-up end signal BOOTUPEND by detecting a falling edge of the output signal of the first logic gate 910.

The second logic gate 920 may invert the boot-up end signal BOOTUPEND, and output a resultant signal.

The third logic gate 930 may output the clock signal CLK_CTRL by performing an AND logic function on the source clock signal CLK and the output signal of the second logic gate 920.

Referring to the operation waveforms of FIG. 5, at least one of signal bits of repair address data FDATA outputted from a fuse set which has been used among the fuse sets of the fuse array 200 has a high level.

Thus, while reading repair address data FDATA for used fuse sets, the edge detector 940 retains the boot-up end signal BOOTUPEND at a low level, and accordingly, the clock signal CLK_CTRL cyclically generates clock pluses.

Meanwhile, since the read operation is continuously performed and repair address data FDATA of an unused fuse set has a low level, the edge detector 940 generates a pulse of the boot-up end signal BOOTUPEND, and accordingly, the clock signal CLK_CTRL is retained at a low level.

Because the clock signal CLK_CTRL is retained at the low level, the counter 400 retains the value of the counting signal OUT<0:n> at a current state, and accordingly, the read operation for the fuse array 200 may be interrupted.

Figure 6:
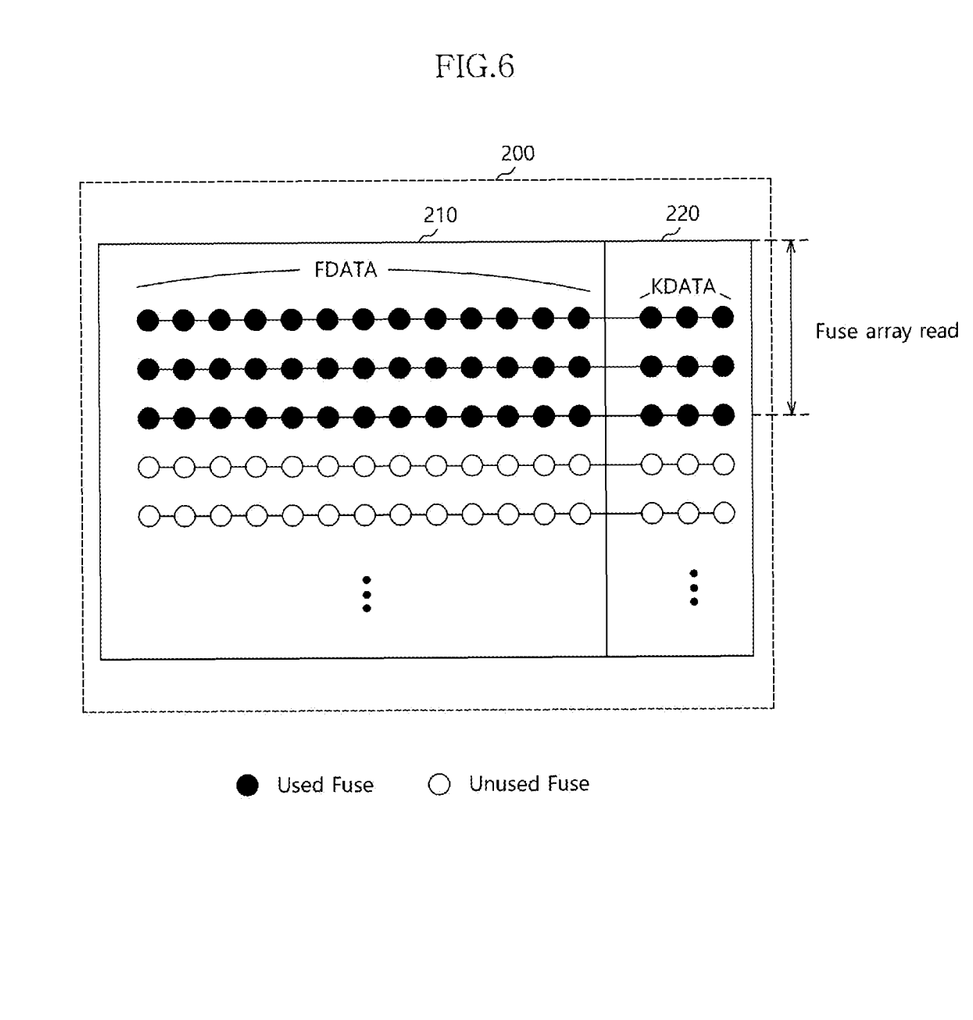
FIG. 6 is a representation of an example of a diagram to assist in the explanation of a fuse array read period according to an embodiment.

Referring to FIG. 6, the read operation may be performed to only a fuse set which is used among the fuse sets of the fuse array 200, for corresponding repair address data FDATA and latch address data KDATA, and may be interrupted for unused fuse sets.

Hereinbelow, examples of semiconductor apparatuses in accordance with embodiments will be described with reference to FIGS. 7 and 8.

Figure 7:
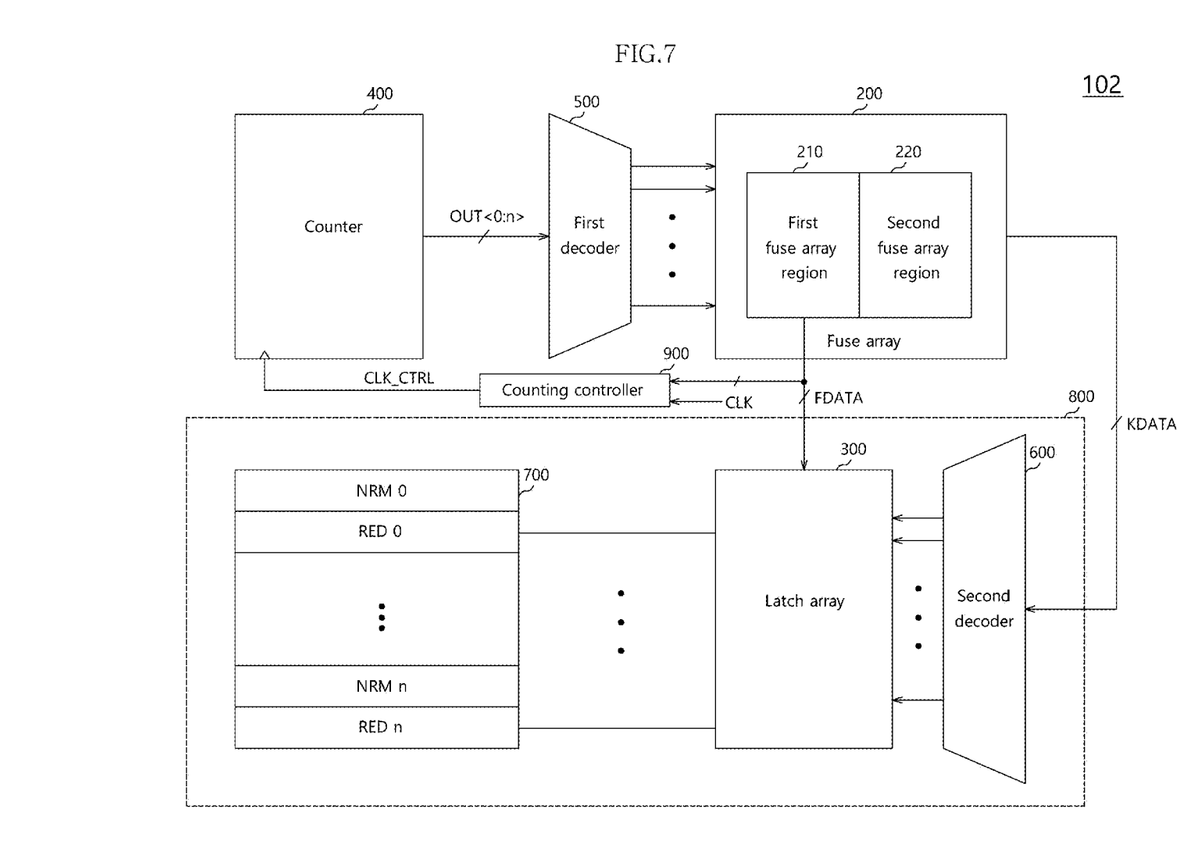
FIG. 7 is a diagram illustrating a representation of an example of the configuration of a semiconductor apparatus 102 in accordance with an embodiment.

Referring to FIG. 7, a semiconductor apparatus 102 in accordance with an embodiment may include a memory region 800, a fuse array 200, a counter 400, a first decoder 500, and a counting controller 900.

The counting controller 900 may be configured to generate a clock signal CLK_CTRL which controls an enable period of a source clock signal CLK, according to repair address data FDATA. The counting controller 900 may be configured as illustrated in FIG. 5 and as discussed with relation to FIG. 5.

The memory region 800 may include a memory cell array 700, a latch array 300, and a second decoder 600.

The memory cell array 700 may correspond to a mat as a small unit memory block or a bank or a plurality of banks as a large unit memory block.

The memory cell array 700 may include a plurality of normal sections NRM and a plurality of redundancy sections RED.

Each of the plurality of normal sections NRM may include normal memory cells.

Each of the plurality of redundancy sections RED may include redundancy memory cells for replacing normal memory cells in which fails have occurred.

As described above with reference to FIG. 2, the latch array 300 may include a plurality of latches. The plurality of latches may be divided by the unit of latches in a row direction, that is, a latch set.

The latch array 300 may be coupled with the plurality of redundancy sections RED.

Repair address data FDATA may be stored in each latch set of the latch array 300.

The second decoder 600 may be configured to select a latch set corresponding to a result of decoding latch address data KDATA, among the latch sets of the latch array 300.

Repair address data FDATA outputted from a fuse set of the fuse array 200 may be stored in the latch set which is selected by the second decoder 600.

The fuse array 200 may basically have a structure in which fuses are arranged as illustrated in FIG. 2, and may be configured to store repair address data FDATA and latch address data KDATA which define positions where the repair address data FDATA are to be stored, among the latch sets of the latch array 300.

The fuse array 200 may be positioned in a peripheral circuit region of the semiconductor apparatus 102.

The fuse array 200 may include a first fuse array region 210 for storing repair address data FDATA and a second fuse array region 220 for storing latch address data KDATA.

The fuses of the fuse array 200 may be divided by the unit of fuses in the row direction, that is, a fuse set.

After a test process, for example, a wafer test or a package test, a row address and a column address corresponding to a memory cell determined as a fail may be detected.

The detected row address and column address may be written in fuse sets of the fuse array 200 as repair address data FDATA, through a rupture process.

The counter 400 may be configured to generate a counting signal OUT<0:n> according to the clock signal CLK_CTRL.

The clock signal CLK_CTRL may be enabled during a period in which a boot-up mode of the semiconductor apparatus 102 is performed.

The first decoder 500 may be configured to select any one of the fuse sets of the fuse array 200 according to the counting signal OUT<0:n>.

The first decoder 500 may sequentially select the fuse sets of the fuse array 200, starting from a most significant fuse set or a least significant fuse set, according to the counting signal OUT<0:n>.

Repair address data FDATA and latch address data KDATA may be outputted from a fuse set of the fuse array 200 which is selected by the first decoder 500.

Repair address data FDATA written in the fuse array 200 may be stored in the latch array 300 during the period of the boot-up mode.

In the semiconductor apparatus 102, after the period of the boot-up mode expires, if an inputted external address has the same value as the repair address data FDATA, a repair operation may be performed by selecting not a memory cell of the normal sections NRM but a redundancy memory cell of the redundancy sections RED matched to a corresponding latch set of the latch array 300.

A semiconductor apparatus 103 in accordance with an embodiment relates to the utilization of surplus fuse sets, described above with reference to FIG. 4.

Memory cells may be divided into normal cells which are determined as passes through a test (for example, a read/write test), failed cells which are determined as fails, and weak cells which are not determined as failed cells but are likely to be determined through a refresh test as failed cells according to a refresh cycle since their data retention times are relatively shorter than normal cells.

Therefore, in the semiconductor apparatus 103 in accordance with an embodiment, addresses of weak cells are written as weak cell data in the surplus fuse sets separately from repair address data FDATA and latch address data KDATA, in such a manner that a refresh operation may be controlled according to the weak cell data.

Figure 8:
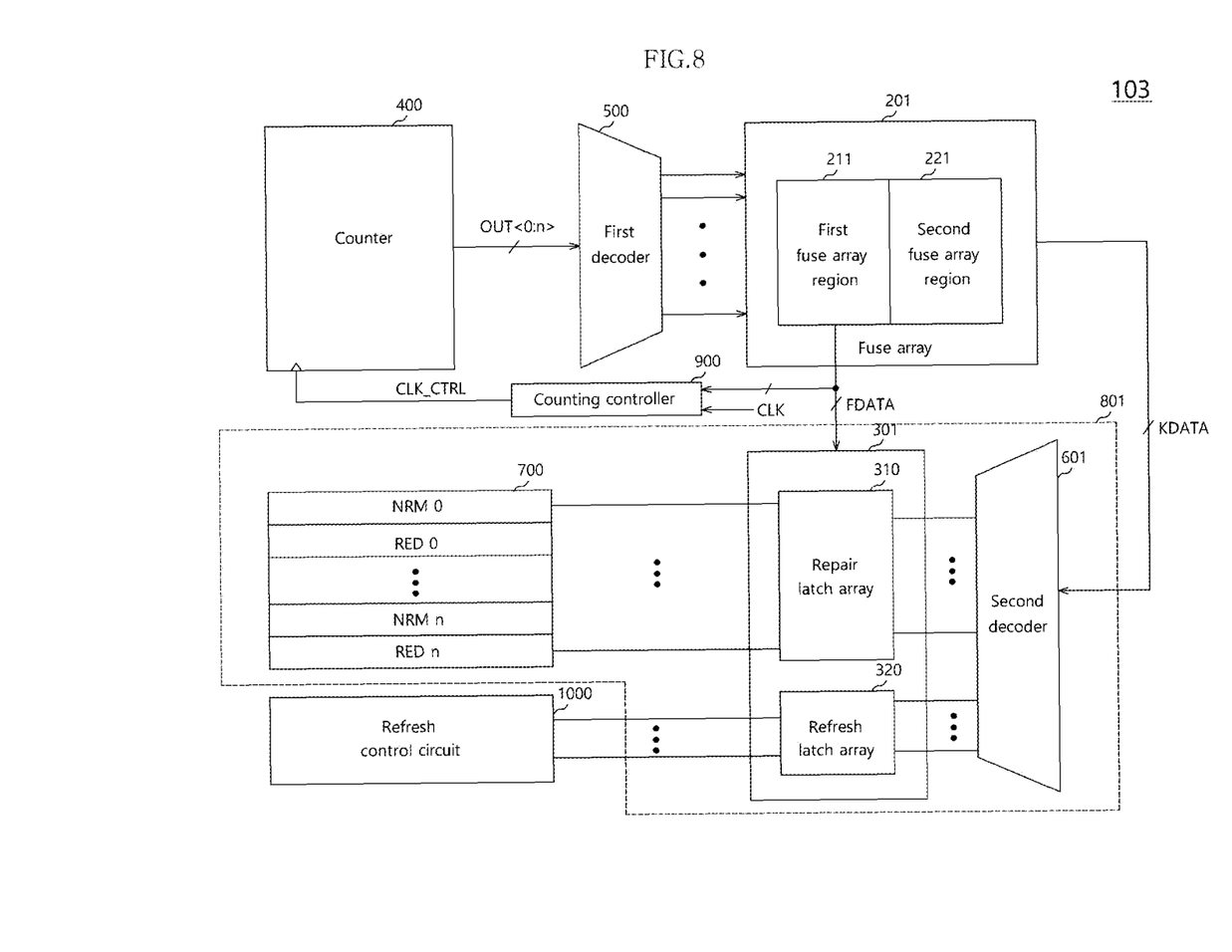
FIG. 8 is a diagram illustrating a representation of an example of the configuration of a semiconductor apparatus 103 in accordance with an embodiment.

Referring to FIG. 8, the semiconductor apparatus 103 may include a memory region 801, a fuse array 201, a counter 400, a first decoder 500, a counting controller 900, and a refresh control circuit 1000.

The counting controller 900 may be configured to generate a clock signal CLK_CTRL which controls an enable period of a source clock signal CLK, according to repair address data FDATA. The counting controller 900 may be configured as illustrated in FIG. 5 and discussed with relation to FIG. 5.

The memory region 801 may include a memory cell array 700, a latch array 301, and a second decoder 601.

The memory cell array 700 may correspond to a mat as a small unit memory block or a bank or a plurality of banks as a large unit memory block.

The memory cell array 700 may include a plurality of normal sections NRM and a plurality of redundancy sections RED.

Each of the plurality of normal sections NRM may include normal memory cells.

Each of the plurality of redundancy sections RED may include redundancy memory cells for replacing normal memory cells in which fails have occurred, that is, failed cells.

The latch array 301 may include a repair latch array 310 and a refresh latch array 320.

The latch array 301 may be coupled with the plurality of redundancy sections RED.

The repair latch array 310 may include a plurality of latches. The plurality of latches may be divided by the unit of latches in a row direction, that is, a latch set.

Repair address data FDATA may be stored in each latch set of the repair latch array 310.

The refresh latch array 320 may include a plurality of latches. The plurality of latches may be divided by the unit of latches in the row direction, that is, a latch set.

Weak cell data may be stored in each latch set of the refresh latch array 320.

The second decoder 601 may be configured to select a latch set corresponding to a result of decoding latch address data KDATA, among the latch sets of the repair latch array 310 and refresh latch array 320.

Repair address data FDATA or weak cell data may be stored in a latch set which is selected by the second decoder 601.

The fuse array 201 may basically have a structure in which fuses are arranged as illustrated in FIG. 2, and may be configured to store repair address data FDATA, weak cell data, and latch address data KDATA which define positions where the repair address data FDATA or the weak cell data are to be stored, among the latch sets of the latch array 301.

The fuse array 201 may be positioned in a peripheral circuit region of the semiconductor apparatus 103.

The fuse array 201 may include a first fuse array region 211 for storing repair address data FDATA and weak cell address data and a second fuse array region 221 for storing latch address data KDATA.

The fuses of the fuse array 201 may be divided by the unit of fuses in the row direction, that is, a fuse set.

After a test process, for example, a wafer test or a package test, a row address and a column address corresponding to a memory cell determined as a fail may be detected.

The detected row address and column address may be written in fuse sets of the fuse array 201 as repair address data FDATA, through a rupture process.

Also, addresses of weak cells detected through a refresh test may be written in partial fuse sets among surplus fuse sets excluding fuse sets used to write the repair address data FDATA, among the fuse sets of the fuse array 201.

The counter 400 may be configured to generate a counting signal OUT<0:n> according to the clock signal CLK_CTRL.

The clock signal CLK_CTRL may be enabled during a period in which a boot-up mode of the semiconductor apparatus 103 is performed.

The first decoder 500 may be configured to select any one of the fuse sets of the fuse array 201 according to the counting signal OUT<0:n>.

The first decoder 500 may sequentially select the fuse sets of the fuse array 201, starting from a most significant fuse set or a least significant fuse set, according to the counting signal OUT<0:n>.

Repair address data FDATA and latch address data KDATA or weak cell data and latch address data KDATA may be outputted from a fuse set of the fuse array 201 which is selected by the first decoder 500.

For example, in a normal operation of the semiconductor apparatus 103, repair address data FDATA and latch address data KDATA may be outputted from a fuse set of the fuse array 201 which is selected by the first decoder 500.

Meanwhile, in the refresh operation of the semiconductor apparatus 103, weak cell data and latch address data KDATA may be outputted from a fuse set of the fuse array 201 which is selected by the first decoder 500.

The refresh control circuit 1000 may control the refresh operation according to the weak cell data stored in the refresh latch array 320 in the refresh operation.

For example, the refresh control circuit 1000 may perform a control task in the refresh operation in such a manner that refresh is performed a larger number of times for memory cells corresponding to the weak cell data stored in the refresh latch array 320, than normal cells.

For another example, the refresh control circuit 1000 may perform a control task in the refresh operation in such a manner that refresh is performed with a shorter cycle for a unit memory block including memory cells corresponding to the weak cell data stored in the refresh latch array 320, than other unit memory blocks.

Repair address data FDATA written in the fuse array 201 may be stored in the latch array 301 during the period of the boot-up mode.

In the semiconductor apparatus 103, after the period of the boot-up mode expires, if an inputted external address has the same value as the repair address data FDATA, a repair operation may be performed by selecting not a memory cell of the normal sections NRM but a redundancy memory cell of the redundancy sections RED matched to a corresponding latch set of the latch array 301.

Figure 9:
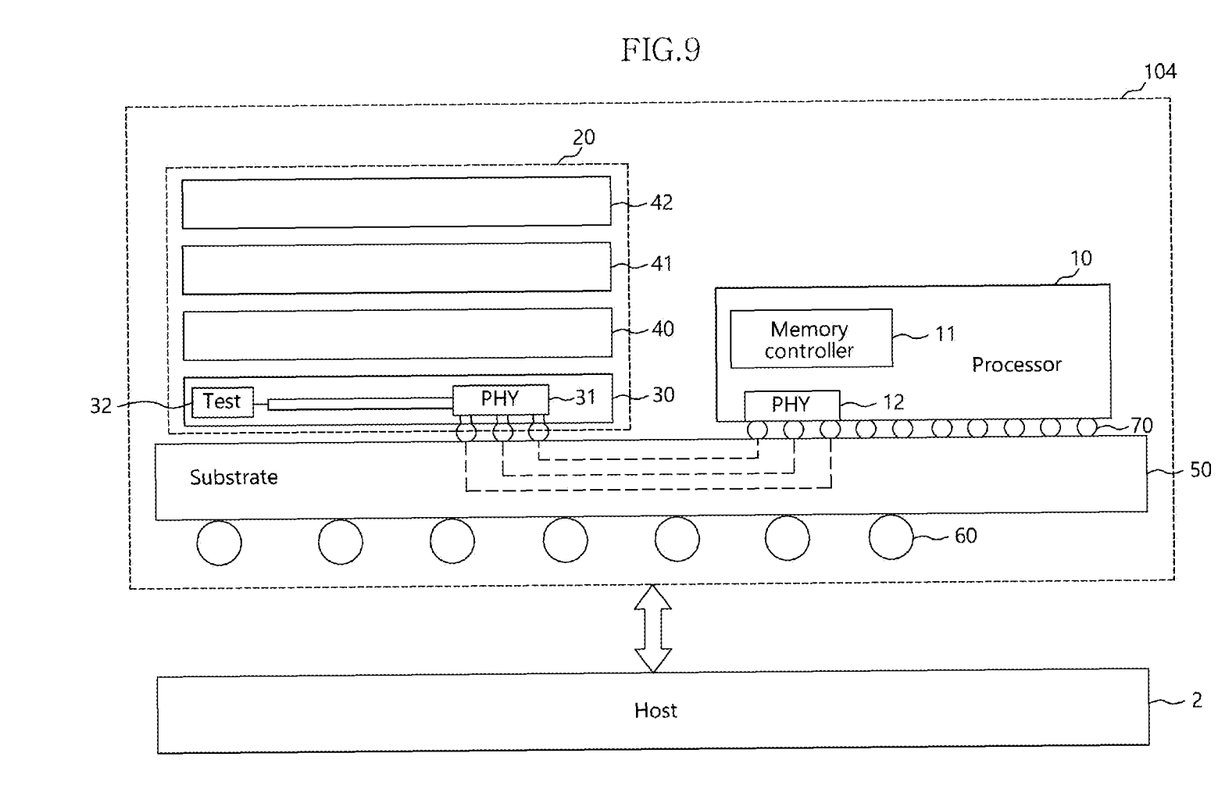
FIG. 9 is a diagram illustrating a representation of an example of the configuration of a semiconductor system 104 in accordance with an embodiment.

Referring to FIG. 9, a semiconductor system 104 in accordance with an embodiment may include a substrate 50, a stacked semiconductor memory 20, and a processor 10.

The semiconductor system 104 may be realized in the type of a system-in-package, a multi-chip package or a system-on-chip, and may be realized in the type of a package-on-package which includes a plurality of packages.

The substrate 50 may provide signal paths for smooth data communication between the processor 10 and the stacked semiconductor memory 20, and may include an additional logic circuit for providing the signal paths and a logic circuit for a test.

The substrate 50 may be realized in various types such as of an interposer and a PCB (printed circuit board). The signal paths provided by the substrate 50 may include electrical coupling paths such as metal layers or through-silicon vias.

The substrate 50 may be electrically coupled with an external device through package balls 60 such as a ball grid array, bump balls and C4 bumps. The external device may be a host 2 which operates by being coupled with the semiconductor system 104.

The substrate 50 may be electrically coupled with the processor 10 and the stacked semiconductor memory 20 through micro bumps 70.

The processor 10 may communicate with the host 2 through a system bus (not illustrated) and the substrate 50, and may perform various calculation operations required by the host 2.

The processor 10 may include at least one among a central processing unit (CPU), a graphic processing unit (GPU), a multimedia processor (MMP) and a digital signal processor (DSP).

The processor 10 may be realized in the types of a system-on-chip, a system-in-package and a package-on-package in which processor chips having various functions, such as application processors (AP), are combined.

The processor 10 may access the stacked semiconductor memory 20 through a memory controller 11.

A physical layer (PHY) 12 of the memory controller 11 and a physical layer (PHY) 31 of the stacked semiconductor memory 20 may convert signals to be exchanged between them, in conformity with the interface between them.

While the present embodiments illustrate an example in which the memory controller 11 is disposed in the processor 10, it is to be noted that, as the case may be, the memory controller 11 may be separately disposed outside the processor 10.

The memory controller 11 may be stacked as any one chip (a base chip or a logic chip) of the stacked semiconductor memory 20.

The memory controller 11 may be separately stacked on the substrate 50 by being separated from the stacked semiconductor memory 20 and the processor 10.

The memory controller 11 may provide a command, an address, a clock and data to the stacked semiconductor memory 20 to control the stacked semiconductor memory 20, and may receive data outputted from the stacked semiconductor memory 20.

The physical layers 12 and 31 may be interface circuits which convert a signal transmitted from the processor 10 or the memory controller 11 into a signal appropriate to be used in the stacked semiconductor memory 20 and output the converted signal or which convert a signal transmitted from the stacked semiconductor memory 20 into a signal appropriate to be used in the processor 10 or the memory controller 11.

The stacked semiconductor memory 20 may be a stacked memory device which includes a plurality of stacked chips.

The stacked semiconductor memory 20 may include a logic chip 30 and a plurality of memory chips 40 to 42 which are sequentially stacked on the logic chip 30.

The logic chip 30 and the plurality of memory chips 40 to 42 may be electrically coupled through vias or bonding wires.

The logic chip 30 may relay signal and data transmission between the memory controller 11 and the plurality of memory chips 40 to 42.

The logic chip 30 may include the physical layer 31, a test circuit 32, and so forth.

The physical layer 31 may receive a signal and data transmitted through the processor 10 or the memory controller 11 and the physical layer 12, and may amplify signals and data outputted from the plurality of memory chips 40 to 42 and transmit the amplified signals and data to the physical layer 12.

The test circuit 32 may perform tests for the plurality of memory chips 40 to 42 by being coupled with the processor 10 or the memory controller 11, or may perform tests for the plurality of memory chips 40 to 42 by being coupled with the host 2, for example, test equipment. Also, the test circuit 32 may independently perform a test for the stacked semiconductor memory 20.

The test circuit 32 may include circuits which may perform tests associated with the plurality of memory chips 40 to 42 and the logic chip 30 at a wafer level and a package level.

The test circuit 32 may include various memory test-related circuits such as a built-in self test circuit, a self repair circuit and a self stress circuit.

The test circuit 32 may perform a couplability test of through vias or micro bumps, a boundary scan test, a burn-in stress test, a data input/output test, a data compression test, and so on.

The test circuit 32 may include a repair logic which replaces a failed memory cell with a redundancy memory cell.

The plurality of memory chips 40 to 42 may respectively have data storage spaces for storing data transmitted through the logic chip 30 from the processor 10 or the memory controller 11.

The plurality of memory chips 40 to 42 may further include logic circuits for performing tests in link with the test circuit 32 of the logic chip 30.

The logic chip 30 and the plurality of memory chips 40 to 42 may be configured by a DRAM or a NAND flash.

While it is illustrated as an example that the stacked semiconductor memory 20 is configured by 4 chips, that is, the logic chip 30 and the plurality of memory chips 40 to 42 which are sequentially stacked on the logic chip 30, it is to be noted that an increased number of chips may be stacked.

Each of the chips of the stacked semiconductor memory 20 may be configured by a DRAM or a NAND flash.

Any one or more chips among the chips of the stacked semiconductor memory 20 may include the repair circuit 100 described above with reference to FIG. 2.

Any one or more chips among the chips of the stacked semiconductor memory 20 may be configured in a type such as the semiconductor apparatus 102 of FIG. 7 or the semiconductor apparatus 103 of FIG. 8.

Meanwhile, any one chip among the chips of the stacked semiconductor memory 20 may include some components of the repair circuit 100 of FIG. 2, and remaining chips may include remaining components excluding the some components of the repair circuit 100 of FIG. 2.

For example, the logic chip 30 among the chips of the stacked semiconductor memory 20 may be configured to include components excluding the latch array 300 of the repair circuit 100 of FIG. 2.

The fuse array 200 of the logic chip 30 may be written with repair address data FDATA, weak cell data and latch address data KDATA corresponding to all failed cells of the memory regions of the plurality of memory chips 40 to 42.

Each of the plurality of memory chips 40 to 42 of the stacked semiconductor memory 20 may include the latch array 300.

The latch array 300 of each of the plurality of memory chips 40 to 42 may be provided with repair address data FDATA, weak cell data and latch address data KDATA corresponding to it, from the fuse array 200 of the logic chip 30 through electrical coupling paths such as through-silicon vias.

While various embodiments have been described above, it will be understood to those skilled in the art that the embodiments described are examples only. Accordingly, the repair circuit, the semiconductor apparatus and the semiconductor system using the same described herein should not be limited based on the described embodiments.

What is claimed is:

1. A repair circuit comprising:
    a latch array including a plurality of latch sets;
    a fuse array including a plurality of fuse sets, and configured to be written, in each fuse set, with repair address data and latch address data which defines a position of a latch set where the repair address data is to be stored, among the plurality of latch sets;
    a first decoder configured to select a fuse set among the plurality of fuse sets; and
    a second decoder configured to select a latch set corresponding to the latch address data among the plurality of latch sets,
    wherein the fuse set, selected by the first decoder, outputs a written data, and
    the latch set, selected by the second decoder, stores the repair address data.

2. The repair circuit according to claim 1, wherein each of the plurality of fuse sets comprises:
    a first fuse array region configured to store the repair address data; and
    a second fuse array region configured to store the latch address data.

3. The repair circuit according to claim 1,
    wherein the first decoder is configured to select the fuse set according to a counting signal, and
    wherein the first decoder is configured to sequentially select the plurality of fuse sets, starting from a most significant fuse set or a least significant fuse set, according to the counting signal.

4. The repair circuit according to claim 1, wherein the repair circuit is configured to perform a repair operation for only fuse sets which have been used among the plurality of fuse sets, by using repair address data.

5. The repair circuit according to claim 1, further comprising:
    a counter configured to generate a counting signal according to a clock signal; and a counting controller configured to output the clock signal by controlling an enable period of a source clock signal according to the repair address data, wherein the first decoder is configured to select the fuse set according to a counting signal.

6. The repair circuit according to claim 1, wherein the second decoder selects the latch set regardless of turns of the plurality of latch sets.

7. The repair circuit according to claim 1, wherein the fuse array is configured to be further written with weak cell data and latch address data which defines a position where the weak cell data is to be stored, among the plurality of latch sets.

8. The repair circuit according to claim 7, wherein the weak cell data defines an address of a memory cell which is likely to be determined as a fail through a refresh test.

9. The repair circuit according to claim 7, wherein each of the plurality of fuse sets comprises:
a first fuse array region configured to store the repair address data or the weak cell data; and
a second fuse array region configured to store the latch address data.

10. The repair circuit according to claim 7, wherein the latch array comprises:
a repair latch array configured to store the repair address data; and
a refresh latch array configured to store the weak cell data.

11. The repair circuit according to claim 1, wherein the latch array is coupled with redundancy sections of a memory region of a semiconductor apparatus.

12. A semiconductor apparatus comprising:
a memory cell array;
a latch array including a plurality of latch sets;
a fuse array including a plurality of fuse sets, and configured to be written, in each fuse set, with repair address data or weak cell data and latch address data which defines a position of a latch set where the repair address data or the weak cell data is to be stored, among the plurality of latch sets;
a first decoder configured to select a fuse set among the plurality of fuse sets;
a second decoder configured to select a latch set corresponding to the latch address data among the plurality of latch sets; and
a refresh control circuit configured to control a refresh operation for a memory cell corresponding to the weak cell data in the memory cell array,
wherein the fuse set, selected by the first decoder, outputs a written data, and
the latch set, selected by the second decoder, stores the repair address data or the weak cell data.

13. The semiconductor apparatus according to claim 12, wherein the first decoder is configured to select the fuse set according to a counting signal, and
wherein the first decoder is configured to sequentially select the plurality of fuse sets, starting from a most significant fuse set or a least significant fuse set, according to the counting signal.

14. The semiconductor apparatus according to claim 12, wherein the semiconductor apparatus is configured to perform a repair operation for only fuse sets which have been used among the plurality of fuse sets, by using repair address data.

15. The semiconductor apparatus according to claim 12, further comprising:
a counter configured to generate a counting signal according to a clock signal; and
a counting controller configured to output the clock signal by controlling an enable period of a source clock signal according to the repair address data,
wherein the first decoder is configured to select the fuse set according to a counting signal.

16. The semiconductor apparatus according to claim 12, wherein the second decoder selects the latch set regardless of turns of the plurality of latch sets.

17. The semiconductor apparatus according to claim 12, wherein each of the plurality of fuse sets comprises:
a first fuse array region configured to store the repair address data or the weak cell data; and
a second fuse array region configured to store the latch address data.

18. The semiconductor apparatus according to claim 12, wherein the latch array comprises:
a repair latch array configured to store the repair address data; and
a refresh latch array configured to store the weak cell data.

19. The semiconductor apparatus according to claim 12, wherein the latch array is coupled with a redundancy section of the memory cell array, and
wherein the fuse array is positioned in a peripheral circuit region of the semiconductor apparatus.

20. The semiconductor apparatus according to claim 12, wherein the refresh control circuit is configured to change a number of refresh times or a refresh cycle for memory cells corresponding to weak cell data.

21. A semiconductor system comprising:
a plurality semiconductor chips that are stacked; and
a processor configured to access the plurality of stacked semiconductor chips,
wherein at least one of the plurality of stacked semiconductor chips comprises a plurality of fuse sets and a plurality of latch sets, and
wherein repair address data and latch address data are stored in each of the plurality of fuse sets, and the repair address data is stored in a latch set corresponding to the latch address data among the plurality of latch sets.

22. The semiconductor system according to claim 21, wherein at least one of the plurality of stacked semiconductor chips comprises:
a first decoder configured to select a fuse set among the plurality of fuse sets according to a counting signal; and
a second decoder configured to select a latch set corresponding to the latch address data among the plurality of latch sets,
wherein the fuse set, selected by the first decoder, outputs a written data, and
the latch set, selected by the second decoder, stores the repair address data.

23. The semiconductor system according to claim 22, wherein the second decoder selects the latch set regardless of turns of the plurality of latch sets.

24. The semiconductor system according to claim 21, wherein the fuse array is configured to be further written with weak cell data and latch address data which defines a position where the weak cell data is to be stored, among the plurality of latch sets.

25. The semiconductor system according to claim 21, wherein the plurality of latch sets are coupled with redundancy sections of memory regions of the plurality of stacked semiconductor chips.

26. The semiconductor system according to claim 24, further comprising:

a refresh control circuit configured to change a number of refresh times or a refresh cycle for memory cells corresponding to weak cell data.

27. The semiconductor system according to claim 21, wherein the plurality of stacked semiconductor chips comprise a logic chip and a plurality of memory chips, wherein the plurality of fuse sets are disposed in the logic chip, and wherein the plurality of latch sets are disposed in at least one of the plurality of memory chips.

28. The semiconductor system according to claim 22, wherein the plurality of latch sets of the memory chip are configured to be provided with repair address data and latch address data through through-silicon vias from the plurality of fuse sets.

* * * * *